(12) United States Patent
Peake et al.

(10) Patent No.: US 8,513,733 B2
(45) Date of Patent: Aug. 20, 2013

(54) EDGE TERMINATION REGION OF A SEMICONDUCTOR DEVICE

(75) Inventors: Steven Thomas Peake, Warrington (GB); Philip Rutter, Stockport (GB)

(73) Assignee: NXP B.V., Eindhoven (NL)

( * ) Notice: Subject to any disclaimer, the term of this patent is extended or adjusted under 35 U.S.C. 154(b) by 25 days.

(21) Appl. No.: 13/210,308

(22) Filed: Aug. 15, 2011

(65) Prior Publication Data

US 2012/0037980 A1   Feb. 16, 2012

(30) Foreign Application Priority Data

Aug. 16, 2010   (EP) .................................... 10172933

(51) Int. Cl.
| | |
|---|---|
| H01L 27/108 | (2006.01) |
| H01L 29/66 | (2006.01) |
| H01L 21/336 | (2006.01) |
| H01L 21/331 | (2006.01) |

(52) U.S. Cl.
USPC ........... 257/330; 257/301; 257/334; 438/259; 438/370

(58) Field of Classification Search
USPC ................. 257/213, 270, 330, 334; 438/259, 438/270, 283, 686, 268
See application file for complete search history.

(56) References Cited

U.S. PATENT DOCUMENTS

| | | | |
|---|---|---|---|
| 7,186,618 B2 * | 3/2007 | Pölzl et al. ..................... | 438/270 |
| 2009/0085105 A1 | 4/2009 | Su et al. | |
| 2009/0127616 A1 | 5/2009 | Akiyama et al. | |
| 2010/0001362 A1 | 1/2010 | Van Dalen et al. | |
| 2010/0072544 A1 | 3/2010 | Pearse et al. | |

FOREIGN PATENT DOCUMENTS

| | | |
|---|---|---|
| WO | 00/42665 A1 | 7/2000 |
| WO | 01/08226 A2 | 2/2001 |

OTHER PUBLICATIONS

Extended European Search Report for Patent Application No. EP10172933.3 (Mar. 9, 2011).

* cited by examiner

Primary Examiner — Ha Tran T Nguyen
Assistant Examiner — Ismail Muse

(57) ABSTRACT

An isolation region (14) is formed between an edge termination region (2) having deep trenches (20,34) and the central region (4). The isolation region includes gate fingers (18) extending from the edge gate trench regions (28) to the gate trenches (6) in the central region (4) to electrically connect the edge gate trench regions to the gate trenches (6) in the central region. The isolation region also includes isolation fingers (22,24) extending from the edge termination region (2) towards the central region (4) and gate between the gate fingers (18) for reducing the breakdown voltage with a RESURF effect.

13 Claims, 3 Drawing Sheets

EDGE TERMINATION REGION OF A SEMICONDUCTOR DEVICE

CROSS-REFERENCE TO RELATED APPLICATIONS

This application claims the priority under 35 U.S.C. §119 of European patent application no. 10172933.3, filed on Aug. 16, 2010, the contents of which are incorporated by reference herein.

The invention relates to an edge termination region for a semiconductor device and a method of making it.

A number of approaches are used to process the edges of semiconductor devices. In general, the intention is to avoid breakdown of the semiconductor device as a result of edge effects.

A prior approach to edge termination, using what is known as a "reduced surface field" effect, is taught in US 2010/0001362. "Reduced surface field" is often abbreviated to RESURF.

According to the invention, there is provided a semiconductor device with an edge termination region according to claim 1.

The inventors have sought to efficiently provide a RESURF structure in the edge termination region to increase the breakdown voltage of the device compared with an arrangement without the RESURF structure.

One approach to such a RESURF structure is taught in US 2010/0001362, as mentioned above. This uses pillars to achieve a suitable structure.

When integrating such pillars into a conventional process, a convenient step to carry out the integration is after the mask step known as contact opening, i.e. after deposition of insulator (such as tetraethylorthosilicate, TEOS) and the creation of openings in the insulator. Ion implantation may be carried out at this point using the insulator to create a plurality of pillars to act as a RESURF structure to protect the remainder of the semiconductor device. The problem with this approach is of course that the implantation can only take place in regions where there is an opening in the insulator. This is fine in the active region, but is not easy to implement in the edge termination region. In particular, there needs to be a gap between the gate metal and the source metal for isolation purposes and in this gap it is not possible to put a contact. Pillars may accordingly not be provided in this gap, which has the result that the breakdown may occur at lower voltage in this region.

To solve this problem, the solution adopted by the inventors is to use a different RESURF effect in the intermediate region, namely by incorporating isolation fingers in this region on both sides of the gate trenches. The gate trenches are used to connect the edge gate trenches with the gate of the semiconductor device in the central active region.

A further factor is that to save silicon area, and indeed one mask, it is convenient to deposit gate metal over the edge region of the semiconductor device and to connect the gate metal to edge gate conductor in trenches in this region. In this case, the gate metal can give rise to significant gate-drain capacitance which can seriously impact the performance of the device.

By providing the isolation fingers alternating with the gate fingers, it is possible to achieve a "reduced surface field" ("RESURF") effect in this region. This can improve capacitance effects, in particular reduced gate-drain capacitance.

In another aspect, the invention relates to a method of making the semiconductor device as taught in claim 11.

For a better understanding of the invention, embodiments will now be described, purely by way of example, with reference to the accompanying drawings, in which.

The same reference numbers are used for the same or corresponding features in the various figures and the description relating to these features is not necessarily repeated. The figures are schematic and not to scale.

Figure 1:
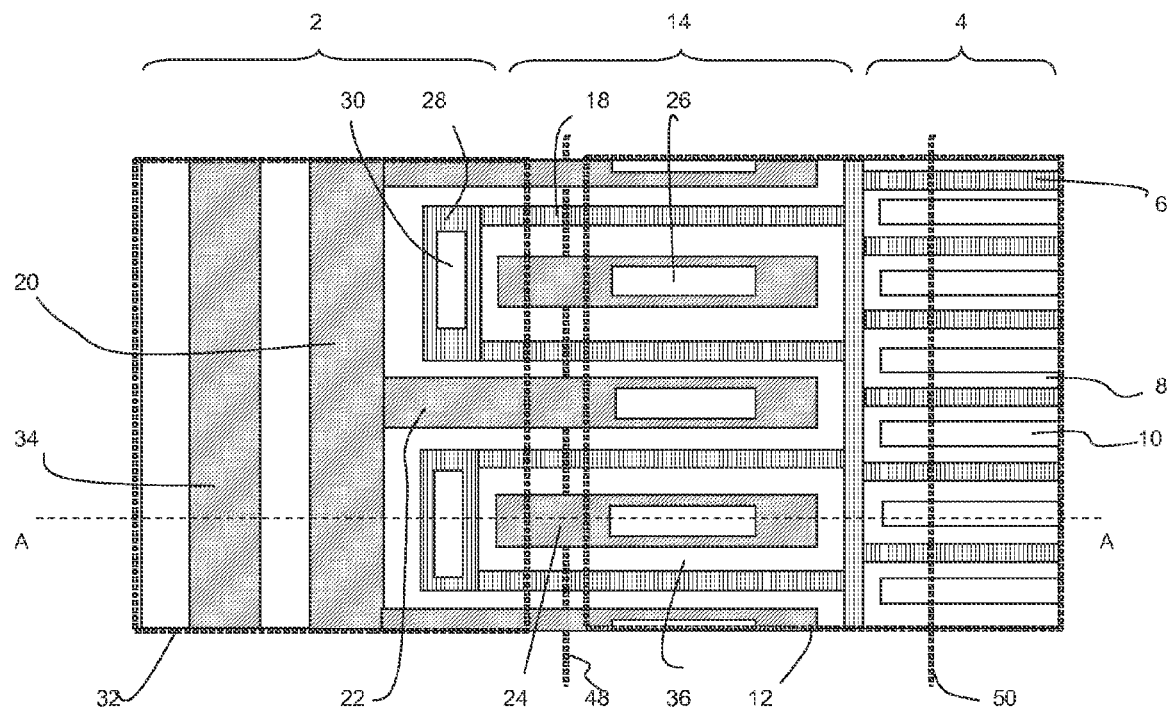
FIG. 1 shows a first embodiment of the invention in top view.
Figure 2:
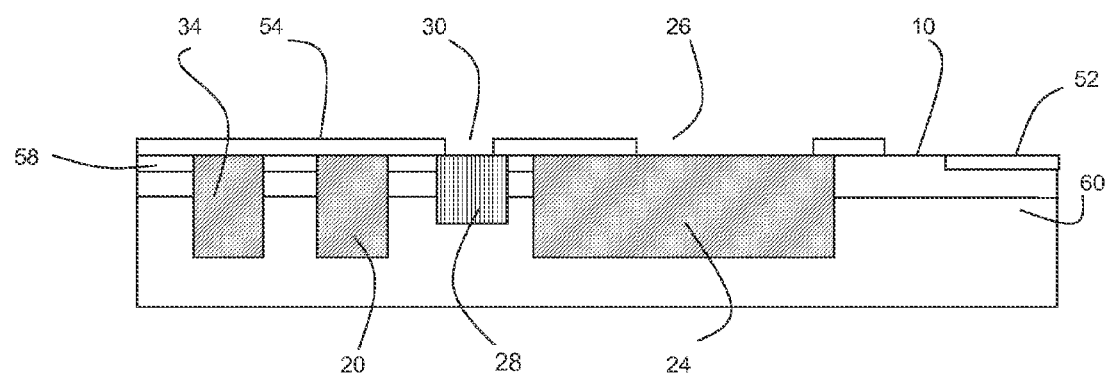
FIG. 2 shows a stage in the manufacture of the first embodiment of the invention in side section along line A-A in FIG. 1.
Figure 3:
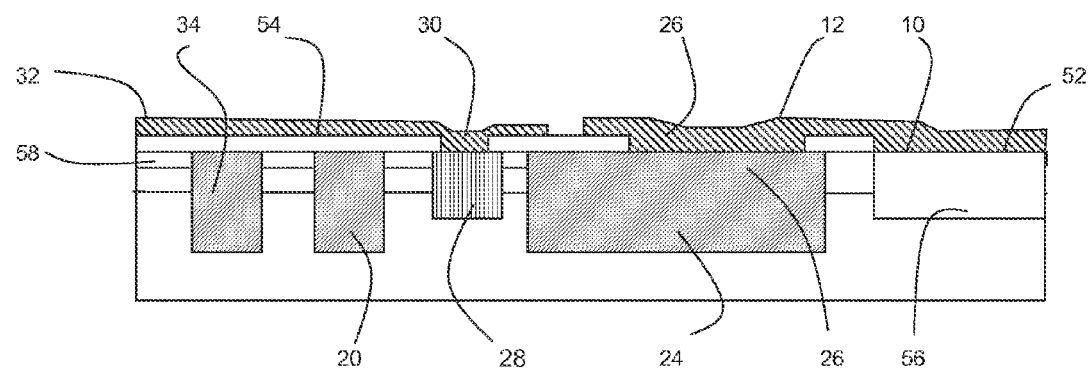
FIG. 3 shows a later stage in the manufacture of the first embodiment of the invention in side section along line A-A in FIG. 1.

Referring to FIGS. 1 to 3, FIG. 1 shows a top view of a semiconductor device according to the first embodiment at a stage of manufacture before the deposition of the gate and source metallisations, though FIG. 1 does show as dotted lines the relevant zones in which these metallisations are deposited, and FIG. 2 a side view of the semiconductor device at this stage. FIG. 3 shows the situation after the deposition of the gate and source metallisations.

The semiconductor device includes an edge termination region 2 and a central region 4. Thus, the left edge of FIG. 1 is the edge of the semiconductor device, the right edge of FIG. 1 is the central region which includes in this embodiment a high voltage semiconductor device. Thus, the direction from top to bottom in FIG. 1 is a circumferential direction, around the circumference of the device, while the direction from left to right is a radial direction, from the edge towards the central region 4.

The central region 4 of the semiconductor device includes gate trenches 6, which alternate with semiconductor body regions 8. The gate trenches are shown with vertical lines. In the example, the depth of the gate trenches is 0.4 µm to 1.2 µm, in some cases up to 1.8 µm. The gate trenches include insulated sidewalls and are filled with a conductive gate. A source region 52 is provided as well as a drain region 60, the latter being constituted by the substrate. The gates in the gate trenches 6 control the vertical conduction between source 52 and drain 60 as is known in the art.

After forming various components in the semiconductor body, an insulator layer 54, in the example of TEOS, is deposited and various contact regions defined by a single mask. In the central region 4, a source contact region 10 is defined at the top of the semiconductor body regions 8 to provide a source contact.

A source metal 12 is provided over this region (FIG. 3), providing an electrical contact to the source contact regions. The semiconductor device thus contains a vertical high voltage field effect transistor in the central region 4, the source 52 being at the top and the drain 60 being the substrate, the high voltage field effect transistor in this instance made up of a single field effect transistor arranged as a repeating cell with a device cell pitch, in the example 1.7 µm.

Those skilled in the art will appreciate that there are other types of device that can be formed in the central region. For example, lateral field effect transistors may also be formed. The central region may also include an integrated circuit with multiple components.

The edge termination formed in edge termination region 2 is formed in a way that does not require too many additional masks or processes. The edge termination includes deep trenches 20,34 extending in the example for a depth of 1.0 μm to 8.0 μm, in the example 2 μm.

An isolation region 14 is formed between the edge termination region 2 and the central region 4. The isolation region 14 comprises isolation fingers 22, 24 extending in the radial direction.

Intermediate semiconductor regions 36 remain separating the isolation fingers 22,24 and the gate fingers 18.

The gate trenches 6 include in particular edge gate trenches 28 in the edge termination region and gate contacts 30 defined in the edge gate trenches. The gate contacts 30 are defined in the same way and the same process as the source contacts 10. Gate fingers 18 alternating with the isolation fingers 22,24 connect the edge gate trenches 28 to the gate trenches 6 in the central region 4.

A gate metal 32 extends over the edge termination region and provides the electrical connection to the gate contacts 30 and hence to the edge gate trenches 28 and via the gate fingers 18 to the gate trenches 6. In this way, the edge termination region 2 is used for the gate connection therefore avoiding the need for a separate region to connect to the gates.

The isolation fingers include first isolation fingers 22 extending from the deep trenches 20 inwards from those trenches past the edge gate trenches 28, and second isolation fingers 24 which are not connected to the deep trenches 20 but which extend in alignment with the edge gate trenches 28 from inwards of the edge gate trenches 28 towards the central region 4. Note that the deep trenches 20, first isolation fingers 22 and second isolation fingers 24 are formed in a single process.

The deep trenches 20,34 and first and second isolation fingers 22,24 have a thick sidewall of oxide and are filled with conductive polysilicon. This may be p-type or n-type, but conveniently is doped highly enough so that the polysilicon functions effectively as a conductor.

Trench contacts 26 are defined over the isolation fingers 22, 24—these are formed in the same process as source contacts 10 and gate contacts 30. The trench contacts 26 connect to the source metal 12 which accordingly overlaps not merely the source contacts 10 in the central region 4 but also overlaps the isolation region 14 to arrange that the deep trenches 20 and isolation fingers 22,24 are connected to the source. Note that it is the first isolation fingers 22 which are in connection with deep trenches 20 that provide the source connection to these deep trenches 20. It will also be noted that there is an outer deep trench 34 that is not connected to the source—this does not cause problems.

By virtue of the source connected isolation fingers 22,24 between the edge gate trenches 28 and the central region 4 containing the active device the capacitance of the edge gate trenches in the edge region is shielded from the device by the reduced surface field effect in the isolation region 14.

To manufacture the device, the manufacture of the device in the central region 4 is relatively standard and so will not be described in full detail. In particular, the formation of vertical field effect transistors with gate trenches 6, body 8, and source and drain 52,60 is known.

One aspect of the manufacture is worth pointing out. The source 52 is formed by an implanted region of higher n-type carrier density than body 8. This is patterned using source-n mask having source-n mask edge 50 (FIG. 1) so that the source 52 does not reach the outer edge of the source contact 10. This mask ensures that the source 52 is not present in the edge termination region, where it may create a parasitic npn transistor which may cause failure if high avalanche currents flow.

In alternative embodiments, the source-n mask is eliminated and the source 52 implantation carried out over the whole surface of the semiconductor device, relying on the improved breakdown achieved by the structure.

During manufacture of the gate trenches 6 in the active region, the same mask and process steps are used to form the edge gate trenches 28 and the gate fingers 18 as described above and as illustrated in FIG. 1.

An isolation definition mask is used to form the deep trenches 20, 34 of the deep trench isolation structure and the fingers 22,24 in a single operation. In principle, this step may take place before or after the manufacture of the gate trenches.

After the formation of the semiconductor body and structures in the body, TEOS layer 54 is deposited over the whole structure and contact openings 30,26,10 formed. At this stage, p-type pillars 56 are deposited through the source contact openings 10 in the central region 4. These provide the RESURF effect in the central region 4. The p-type pillars are thus aligned with the source contact openings 10. Note that the structure of the semiconductor device of source, body and drain is maintained adjacent to the gate trenches 6 since the source contact openings 10 do not extend as far as the gate trenches. Thus, the function of the semiconductor device is maintained.

A further etch, a moat etch is then performed (not shown) through the same openings 30,26,10, which is relatively shallow compared with the deep trenches. Then, a metal layer is deposited and a further mask used to pattern this layer to form gate metal 32 and source metal 12, the former in connection with gate contact 30 and the latter in connection with source contact 10 and trench contact 26. The moat etch means that the metal layer contacts the polysilicon not just at the surface but also at the sides of the moat, which can act to improve the connection of the gate metal 32 and source metal 12. If this improvement is not required, the moat etch also can be omitted.

It should be noted that the Figures are not to scale—in fact the slight dips shown in the top of the metallisation layer of FIG. 3 can in real life be relatively deep trenches, with depths of order the width or depths double the width. These can be filled if required with tungsten plugs.

A number of other aspects of this arrangement are worth noting.

Firstly, the edge cell pitch in the region of the edge gate trenches 28 and the isolation fingers 22, 24 is not the same as the device cell pitch in the central region 4. The pitch of the edge gate trenches is considerably larger, This allows enough space for the shielding isolation fingers 22, 24.

The gate trenches 6 of the device in the central region are connected to gate metal 32 at the edge gate trenches 28 which are wider than the gate trenches elsewhere in the structure. This makes for improved connection to the gate.

The structure includes floating intermediate semiconductor regions 36. In many examples, this will not cause a problem since the area is quite small and the regions are bounded by deep trenches, the isolation fingers 22,24.

Figure 4:
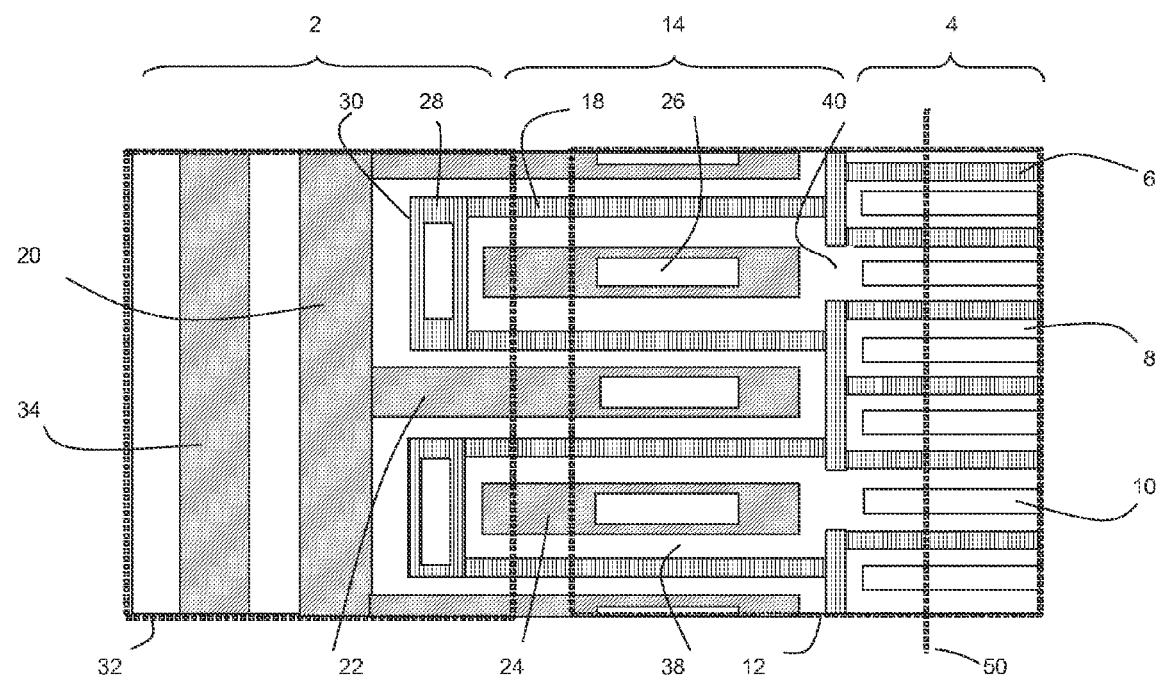
FIG. 4 shows a second embodiment of the invention.

However, a change in device structure in the alternative embodiment illustrated in FIG. 4 ensures that these intermediate semiconductor regions are not floating but are source connected intermediate semiconductor regions 38. This is ensured by bridge 40 joining the intermediate semiconductor regions 38 to the source regions 8 in the central region 4.

Figure 5:
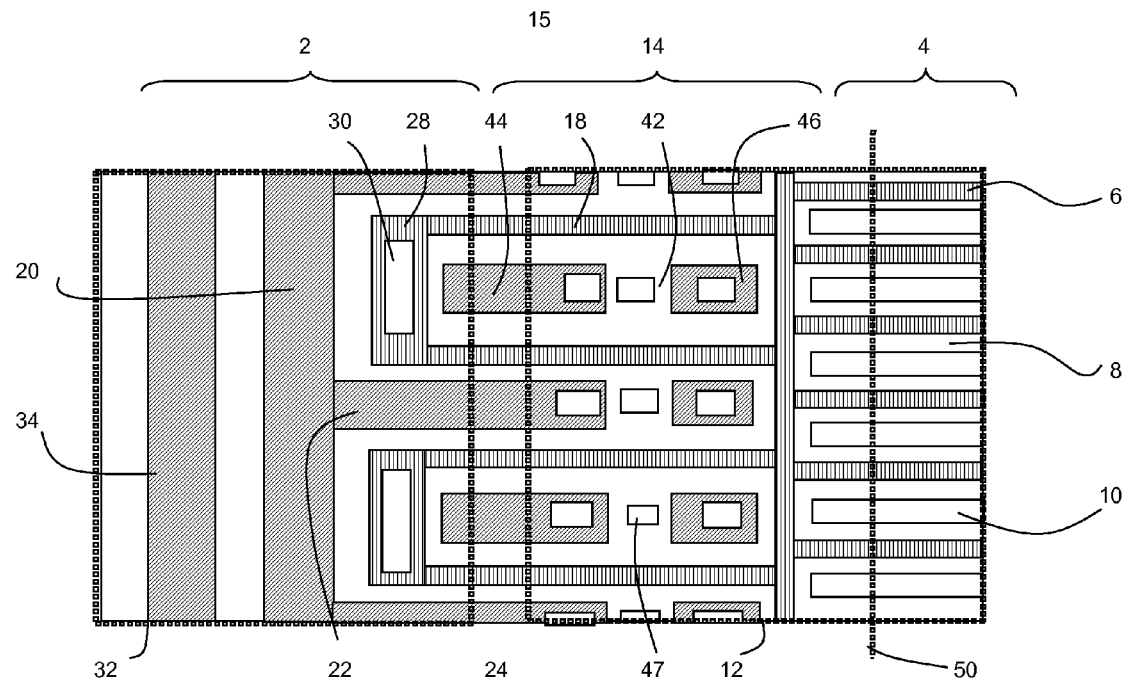
FIG. 5 shows a third embodiment of the invention.

An alternative change to the device structure of FIG. 1 to achieve the same result is shown in FIG. 5.

In this case, the isolation fingers 22, 24 are each broken into two, namely an outer region 44, an inner region 46, and a bridge 42 between the outer region and the inner region.

Source contacts 47 are provided in each of the outer region 44, the inner region 46 and the bridge to connect each of these to the source metal 12. Thus in this embodiment the bridge 42 provides the source connection of the semiconductor in the isolation regions.

Figure 6:
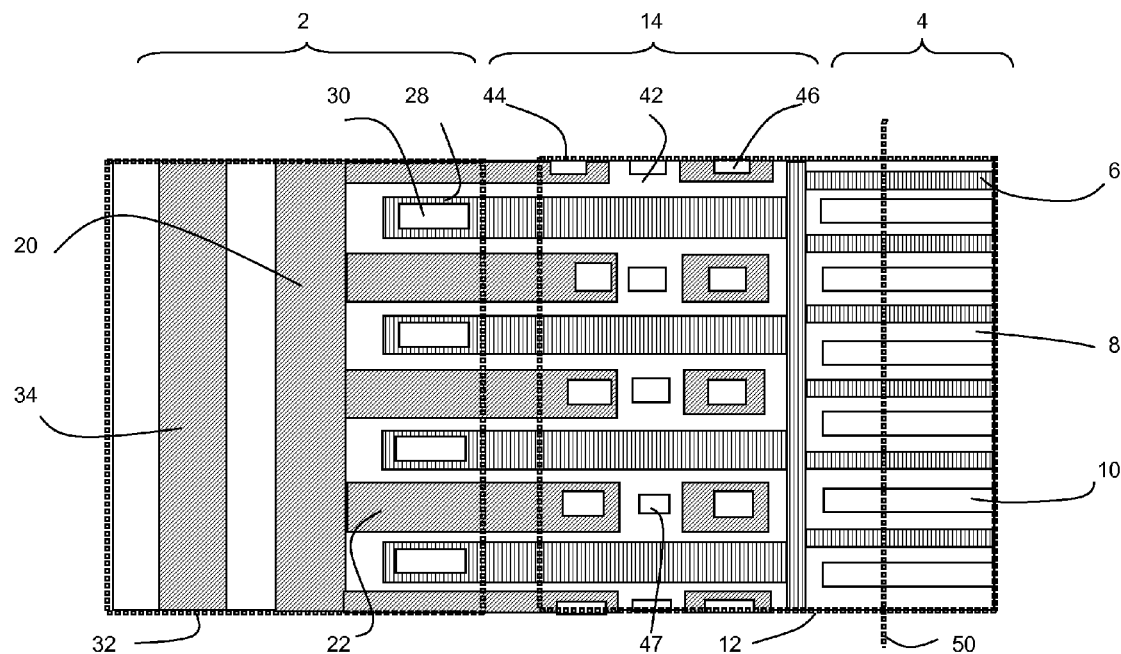
FIG. 6 shows a fourth embodiment of the invention.

A further variation is shown in FIG. 6. In this case, the first and second isolation fingers 22,24 are replaced by a single set of isolation fingers 22 that simply alternate with the edge gate trenches 28. In this case, the edge gate trenches are oriented to extend towards the central region 4 rather than to extend circumferentially as in the embodiments of FIGS. 1 to 3.

Further, in the example shown the isolation fingers 22, 24 are connected to the source, but in alternative embodiments these may be left floating.

Those skilled in the art will realise that modifications are possible. For example, the term "metal" in the terms "source metal" and "gate metal" is not intended to exclude metallic, conductive arrangements that are not strictly speaking pure metal.

The invention claimed is:

1. A semiconductor device having an edge termination region, the device comprising:
    a central active region forming at least one field effect transistor with a semiconductor body having a source, drain and gate,
    an edge termination region including at least one deep trench region and a plurality of edge gate trench regions, the edge gate trench regions comprising an insulated gate in a trench; and
    an isolation region between the edge termination region and the central active region, the isolation region comprising gate fingers extending from the edge gate trench regions to gate trenches in the central region to electrically connect the edge gate trench regions to the gate trenches in the central region, and the isolation region further comprising conductive isolation fingers extending from the edge termination region towards the central region and gate between the gate fingers.

2. A semiconductor device according to claim 1, wherein the source is of first conductivity type, connected to a source metal through a plurality of source contacts, the semiconductor device further comprising a region of second conductivity type extending into the semiconductor body from the source contacts arranged to reduce the breakdown voltage in the central region.

3. A semiconductor device according to claim 2 wherein the source metal is further connected to trench contacts on the isolation fingers to connect the isolation fingers to the source.

4. A semiconductor device according to claim 1, further comprising a gate metal over the edge gate trench regions connected to the edge gate trench regions through a gate contact on the edge gate trench regions to provide a gate connection to the semiconductor device.

5. A semiconductor device according to claim 1 wherein the central region includes a plurality of source contacts at a source pitch, and the pitch of the plurality of edge gate trench regions is greater than the source pitch.

6. A semiconductor device according claim 1, further comprising an n-well in the edge termination region.

7. A semiconductor device according to claim 1 further comprising a gate metal over the edge termination region directly in contact with gate contacts in the edge gate trench regions to provide a gate connection to the semiconductor device.

8. A semiconductor device according to claim 1, wherein the fingers include:
    a first set of isolation fingers being extensions of the deep trench regions, and
    a second set of isolation fingers being separated from the deep trench isolation regions by the edge gate trench regions and alternating with the first set of isolation fingers.

9. A semiconductor device according to claim 1, wherein the isolation fingers are each extensions of the deep trench regions and
    the isolation fingers alternate with the edge gate trench regions.

10. A semiconductor device according to claim 1, wherein at least some of the isolation fingers have an outer region being an extension of the deep trench region, and an inner region separated from the outer region by a finger semiconductor region,
    further comprising a source contact in each of the outer region, the finger semiconductor region and the inner region of at least some of the isolation fingers, the source contacts being connected to source metal.

11. A method of manufacturing a semiconductor device, comprising:
    (a) forming a central active region with at least one field effect transistor with a semiconductor body of a first conductivity type, the field effect transistor having a source, drain and gate,
    (b) forming an edge termination region including at least one deep trench isolation region and a plurality of edge gate trench regions, the edge gate trench regions comprising an insulated gate in a trench;
    (c) forming an isolation region between the edge termination region and the central active region, the isolation region comprising gate fingers extending from the edge gate trench regions to gate in the central region and the isolation region further comprising conductive isolation fingers extending from the edge termination region towards the central region and gate between the gate fingers;
    where steps (a), (b), and (c) can take place in any order and/or concurrently, the method further comprising:
    (d) depositing an insulating layer;
    (e) forming contact openings in the insulating layer; and
    (f) implanting regions of a second conductivity type opposite to the first conductivity type through the contact openings arranged to reduce the breakdown voltage of the device.

12. A method according to claim 11 including implanting over the complete semiconductor device a region of first conductivity type of higher doping concentration than the semiconductor body to form the source in the central region.

13. A method according to claim 11 further comprising implanting a counter doping of second conductivity type in the edge termination region to reduce the doping of first conductivity type at the surface of the semiconductor in the edge termination region.

* * * * *